June 11, 1963 B. CHRISTENSEN 3,093,752

FUNCTION GENERATOR AND FREQUENCY DOUBLER USING NON-LINEAR CHARACTERISTICS OF SEMICONDUCTIVE DEVICE

Filed Aug. 24, 1959 3 Sheets-Sheet 1

WITNESSES

Edwin E. Bassler

James F. Young

INVENTOR

Bent Christensen

BY V. W. Cleary

ATTORNEY

June 11, 1963 B. CHRISTENSEN 3,093,752

FUNCTION GENERATOR AND FREQUENCY DOUBLER USING NON-LINEAR CHARACTERISTICS OF SEMICONDUCTIVE DEVICE

Filed Aug. 24, 1959 3 Sheets-Sheet 3

United States Patent Office 3,093,752 Patented June 11, 1963

3,093,752

FUNCTION GENERATOR AND FREQUENCY DOUBLER USING NON-LINEAR CHARACTERISTICS OF SEMICONDUCTIVE DEVICE

Bent Christensen, Monroeville, Pa., assignor to Westinghouse Electric Corporation, East Pittsburgh, Pa., a corporation of Pennsylvania Filed Aug. 24, 1959, Ser. No. 835,488
13 Claims. (Cl. 307—88.5)

This invention relates to a function generator and more particularly to an apparatus which utilizes characteristics of a semiconductor so as to produce an output current which is a nonlinear function of the input current.

An object of the invention is to provide a semiconductor device having an output current which is a nonlinear function of the input current.

Another object of the invention is the provision of a semiconductor apparatus wherein the output current is a parabolic function of the input current.

Still another object of the invention is to provide a semiconductor apparatus wherein the output signal has a frequency twice the frequency of the input signal.

A further object of the invention is the provision of a semiconductor apparatus wherein the output signal has a frequency twice the frequency of the input signal without requiring the use of tuned circuits or inductor members.

A still further object of the invention is to provide a semiconductor apparatus wherein the output current is a parabolic function of the input current with no components of the frequency of the input current being present in the output current.

Other and incidental objects of the invention will be apparent to those skilled in the art from a reading of the following specification and inspection of the accompanying drawing, in which.

Figures 1, 2, 3:
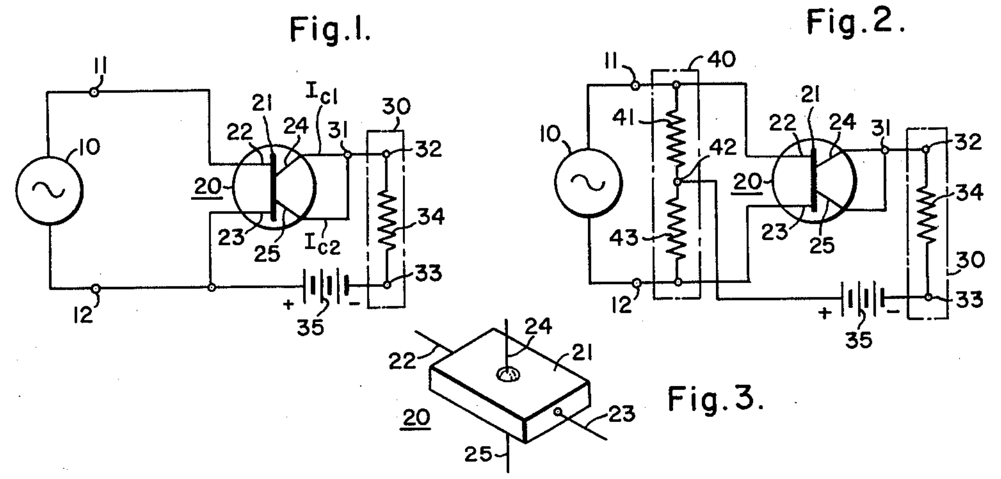
FIGURE 1 is a schematic diagram of a semiconductor apparatus embodying the invention.
FIGURE 2 is a schematic diagram of a semiconductor apparatus embodying the invention.
FIG. 3 is a detailed view of the semiconductor material which may be used in the apparatus shown in FIGS. 1 and 2.

The embodiment of the invention shown in FIG. 1 utilizes a semiconductor device 20 which consists of a body of semiconductor material 21 of a predetermined polarity conductivity type. On opposite sides of the semiconductor body 21 are two electrodes 24 and 25 which are connected with said body for receiving conduction carriers from the body 21 and are of opposite polarity as the conductivity type of the body 21. These connections are illustrated in FIG. 1 and FIG. 3 as connections 24 and 25. When a signal is applied to the semiconductor 20, there will be an output current through the electrodes 24 and 25 which are on an axis that is orthogonal to the axis defined by the input connections 22 and 23. If a return path is provided between the electrodes 24 and 25 to the input connections, the resulting current passing through the electrodes will be within certain defined limits a parabolic function of the input current. The parabolas defining the output current as a function of the input current through these two electrodes have been found not to be identical, but rather offset with respect to the zero input current and additionally generally not symmetrical about any given input current. However, if the currents through these two electrodes 24 and 25 are added or summed, it has been found that the parabola defining the total output current as a function of the input current more nearly approaches a symmetrical parabola. In employing the sum of the current through the two electrodes, the output current is a parabolic function of the input current over a relatively wide range of the input currents. Additionally, if the parabola defining the output current as a function of the input current, is made symmetrical about zero input current, the output current will not have any component of the fundamental frequency of the input current. Since the output current is a parabolic function of the input current, the frequency of the output current, therefore, will have a frequency at least twice the frequency of the input current.

Semiconductor materials suitable for the operation of this device are such as germanium and silicon or stoichiometric compounds from the group III–group V elements of the periodic table, for example, indium arsenide, indium phosphide, and gallium phosphide. These semiconductor materials may be intrinsic or doped to P or N type conductivity. However, the doping purities should not be present in excessive amounts which would be detrimental to the semiconductor properties.

The embodiment of the invention shown in FIG. 1 comprises more specifically a pair of input terminals 11 and 12 which are adapted to be connected to a source of alternating current voltage 10. These input terminals are also connected to input connections 22 and 23 so as to provide an alternating current signal through the body of semiconductor material 21 between opposite ends of the body of material. The input connections 22 and 23 are ohmic contacts with the body 21 on an axis transverse or lengthwise of said semiconductive body 21. The body of material 21 is made of a semiconductive material of a predetermined polarity conductivity type. On opposite sides of the body 21 are positiloned to electrodes 24 and 25 which are positioned on an axis orthogonal to the axis described by input connections 22 and 23. These electrodes constitute connections with the body member 21 for receiving conduction carriers from the body member 21. That is to say, if a body member 21 is of the N type, the electrode connections 24 and 25 will then be of the P type, and vice versa. The electrodes 24 and 25 are connected to a common connection 31 of the output circuit 30. The output circuit 30 further includes output terminals 32 and 33 which are connected to a load illustrated in FIG. 1 as 34. A return path is provided between the output terminal 33 and the input connection 23. This return path includes a bias supply 35 as shown in FIG. 1. In the embodiment shown in FIG. 1, an N type semiconductor body 21 is employed and the junctions 24 and 25 are of the P type. Therefore, the negative side of the D.C. supply 35 is connected directly to the second output terminal 33 whereas the positive side is connected to the input terminal 12 and the input connection 23.

Figure 4:
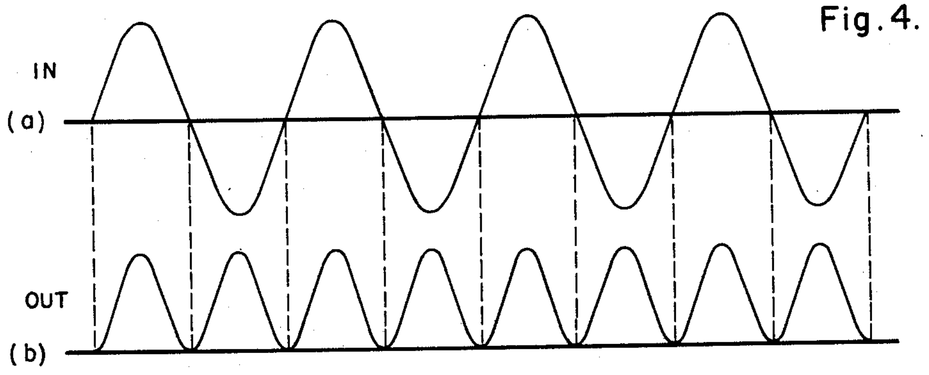
FIG. 4 illustrates the waveforms of the input and output signals of the apparatus shown in FIG. 2.
Figure 5:
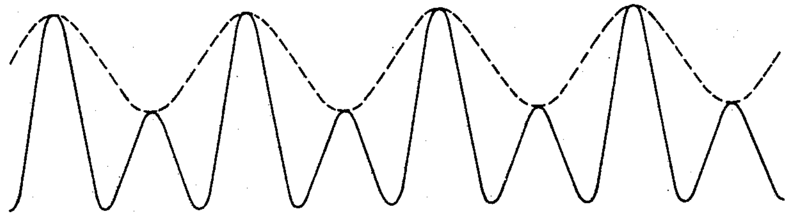
FIG. 5 is a typical characteristic curve of the output current vs. the input current produced by the apparatus shown in FIG. 1.
Figure 6:
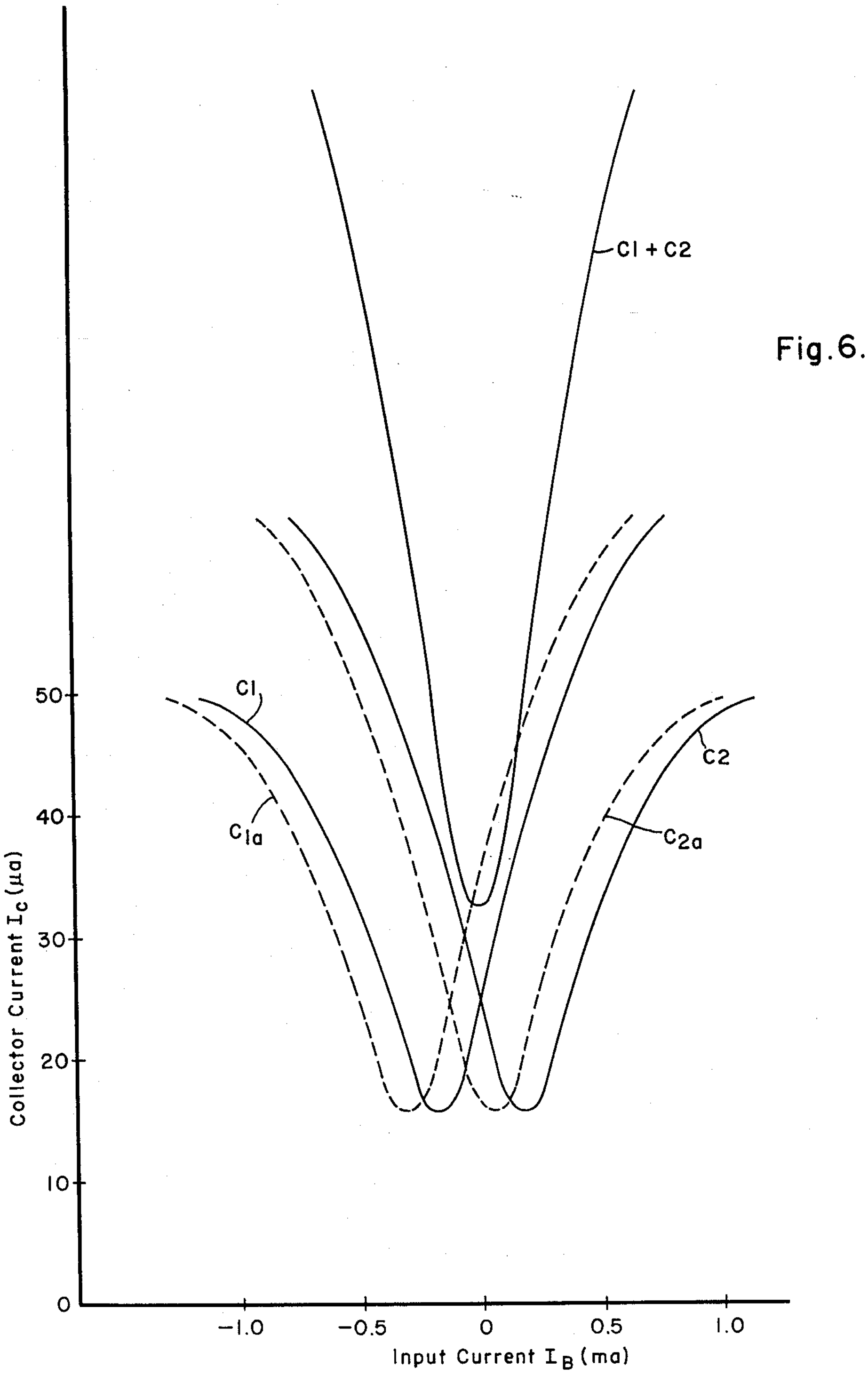
FIG. 6 illustrates a characteristic curve useful in explaining the invention.

When an alternating current signal is generated by the generator supply 10, an alternating current will be passed between the input connections 22 and 23. This input signal is illustrated in FIG. 4(*a*). The output across the load 34 will be the resultant of the two currents $I_{c1}$ and $I_{c2}$ passing through the electrodes 24 and 25. When the currents $I_{c1}$ and $I_{c2}$ are plotted against the current $I_b$, that is the base current, the resulting curve will be as illustrated in FIG. 6. $C_{1a}$ illustrates the curve plotting $I_{c1}$ against $I_b$ and $C_{2a}$ illustrates plotting $I_{c2}$ against $I_b$. As can be seen from these curves, the lower portions of these curves are generally parabolic in shape; however, the middle and upper portions are not symmetrical. Further, neither of these two curves are centered or positioned about zero base current. Since these curves are not centered about a zero base current line, the output of the device shown in FIG. 1 will contain a component of the first or fundamental frequency applied to the input connections 22 and 23, as illustrated in FIG. 5. By adding the two currents $I_{c1}$ and $I_{c2}$, however, the upper nonsymmetrical portions of the $C_{1a}$ and $C_{2a}$ compensate or offset their nonsymmetry so that the resultant current is more nearly parabolic to a considerably higher limit.

It will be understood that the curves illustrated in FIGS. 5 and 6 are examples of tests made and will vary depending upon the individual characteristic of the semiconductor employed, and will vary within certain ranges. If, for example, the device shown in FIG. 1 produces the curves illustrated as $C_{1a}$ and $C_{2a}$ in FIG. 6, the resultant output current will be $C_{1a}+C_{2a}$. That is, this resultant output current will have a frequency twice the frequency of the input current; however, since the curves $C_{1a}+C_{2a}$ are not symmetrical about the zero base current axis shown in FIG. 6, it will contain a component of the frequency of the input signal as illustrated in FIG. 5.

FIG. 2 illustrates a device wherein the parabola defining the input current plotted against the resultant output current is symmetrical about zero base current. This resultant parabolic function is shown in FIG. 6 and illustrated as C1+C2. The resulting output signal for this device is shown in FIG. 4(*b*) wherein the output signal has a frequency twice the frequency of the input signal shown in FIG. 4(*a*), and contains no component of the input signal.

The apparatus shown in FIG. 2 is identical to the apparatus shown in FIG. 1 with the exception of the return path which additionally employs a voltage divider 40 between the input connections 22 and 23. The voltage divider 40 comprises a resistor 41 which is connected between the input connection 22 and a point of common potential 42 with a second resistor 43 connected between the point of common potential 42 and the input connection 23. The return path from the output terminal 33, in the device shown in FIG. 2 is connected between the output terminal 33 and the point of common potential 42. As illustrated in FIG. 2, the negative side of the D.C. supply 35 is connected to the output terminal 33 and the positive side is connected to the point of common potential 42. By employing the voltage divider 40, the return current passing into the input connections 22 and 23 is made substantially equal. This results in the shifting of the parabolas illustrated as $C_{1a}$ and $C_{2a}$ in FIG. 6. By employing this voltage divider, the curves $C_{1a}$ and $C_{2a}$ are shifted to a position illustrated as C1 and C2. As can be seen from this graph, the lower portions of the parabolas C1 and C2 are approximately equidistant from the zero base current axis. Consequently, when the currents $I_{c1}$ and $I_{c2}$ are added, the resultant current is a parabolic function of the input current with this parabola being substantially symmetrical about or centered about the zero base current axis. This resultant parabola is illustrated as C1+C2 in FIG. 6. Thus, the output current of the apparatus shown in FIG. 2 has a waveform as illustrated in FIG. 4(*b*) with an input current as illustrated in FIG. 4(*a*).

The circuits illustrated in FIG. 1 and FIG. 2 were tested. The circuit shown in FIG. 2 gave results substantially as shown by the curves C1 and C2 and C1+C2 in FIG. 6 using N type germanium with two P type junctions connected as shown in FIG. 3. The device worked well from below 5 c.p.s. to above 5000 c.p.s. The D.C. supply 35 employed was 10 volts with an output impedance 34 of 100,000 ohms.

Figure 7:
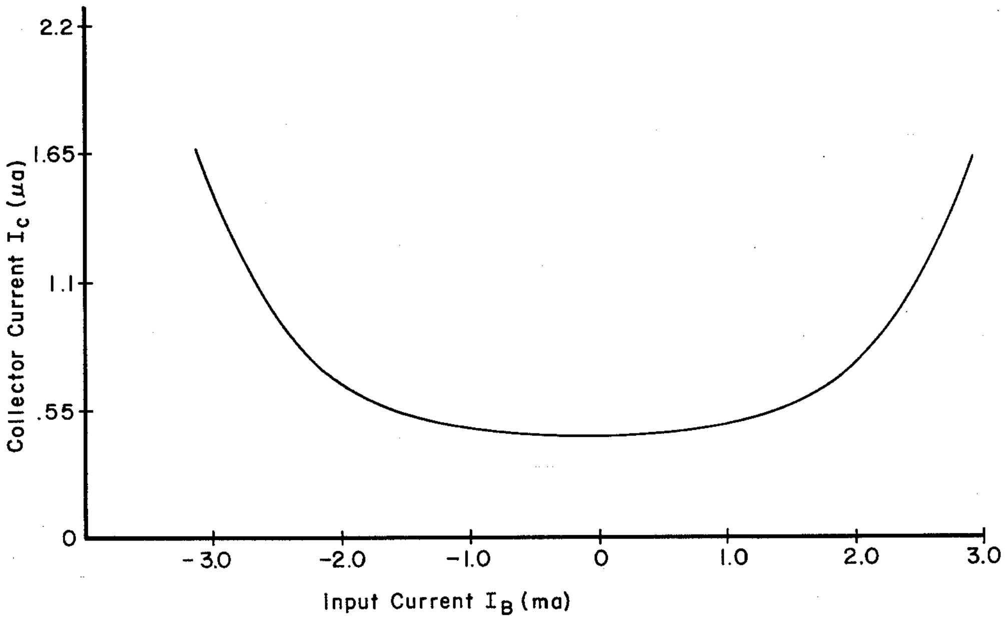
FIG. 7 illustrates a characteristic curve useful in explaining the invention.

When N type silicon was used with two P type junctions the results were substantially as shown in FIG. 7. It will be noted that the results of these tests are a fourth order parabolic curve whereas the curves in FIG. 6 are a second order parabolic curve.

In both of the above cases a relatively thin body of semiconductor material 21 was employed with electrodes 24 and 25 as shown in FIG. 3.

Whereas the invention has been shown and described with respect to two embodiments thereof which give satisfactory results, it should be understood that changes may be made and equipment may be substituted without departing from the spirit and scope of the invention.

I claim as my invention:

1. In a semiconductor apparatus, the combination comprising, a body of semiconductor material of a predetermined polarity conductivity type, means for applying an alternating current through said body along an axis between two opposite ends of said body, a pair of electrodes connected to said body along another axis substantially orthogonal to said axis intermediate the ends thereof, said electrodes comprising a connection with said body and having opposite polarity conductivity type to the conductivity type of said body, and an output circuit including a first output terminal, and a second output terminal, and said pair of electrodes being connected to said first output terminal.

2. In a semiconductor apparatus, the combination comprising, a body of semiconductor material of a predetermined polarity conductivity type, means for applying an alternating current along an axis between the opposite ends of said body, a pair of electrodes connected to said body along another axis substantially perpendicular to said axis, said electrodes comprising a connection with said body and having opposite polarity to the conductivity type of said body, an output circuit comprising a first and a second output terminal, and means for connecting said electrodes to said first output terminal.

3. In a semiconductor apparatus, the combination comprising, a body of semiconductor material of a predetermined polarity conductivity type, a first and a second input connection on said body for applying an alternating current along an axis between two opposite ends of said body, a pair of electrodes connected to said body along another axis substantially orthogonal to said axis, said electrodes comprising a connection with said body and being of opposite polarity to the conductivity type of said body, and an output circuit including a first and a second output terminal, said pair of electrodes being connected to said first output terminal, and a return current path between said second output terminal and said second connection.

4. In a semiconductor apparatus, the combination comprising, a body of semiconductor material of a predetermined polarity conductivity type, means for applying an alternating current along an axis between two opposite ends of said body comprising a first and second input connection with said body, a pair of electrodes connected to said body along another axis substantially orthogonal to said axis intermediate the ends of said body, said electrodes comprising a connection with said body of opposite polarity to the conductivity type of said body, an output circuit comprising a first and a second output terminal, said pair of electrodes being connected to said first output terminal, and a signal return path including a voltage divider connected between said first and said second input connections in a return conductor path between said second output terminal and said voltage divider for dividing the return current equally between said first input connection and said second input connection.

5. In a semiconductor apparatus, the combination comprising a body of semiconductor material of a predetermined polarity conductivity type, a first and a second input connection at the ends of said body for applying an alternating current through said body along an axis between two opposite ends of said body, a pair of electrodes connected to said body along another axis substantially orthogonal to said axis intermediate the ends thereof, said electrodes of the polarity conductivity type opposite to the polarity conductivity type of said body, and an output circuit comprising a first and a second output terminal, said electrodes being connected to said first output terminal, a return current path comprising a voltage divider connected between said first and said second input connections for equally dividing the return current between said first and said second input connections, comprising a first resistor connected between said first input connection in a common connection, a second resistor connected between said second input connection and said common connection, and a return current path connected between said second output terminal and said common connection.

6. In a semiconductor apparatus, the combination comprising, a body of semiconductor material selected from the group consisting of germanium and silicon and of a predetermined polarity conductivity type, means for applying an alternating current along an axis between two opposite ends of said body, a pair of electrodes connected to said body along another axis substantially orthogonal to said axis intermediate the ends of said body, said electrodes having a polarity conductivity type opposite to the polarity conductivity type of said body, and an output circuit including a first and second output terminal, said electrodes having a common connection to said first output terminal for applying a current to an output load which varies as the sum of the current through said pair of electrodes.

7. In a semiconductor apparatus, the combination comprising, a body of semiconductor material selected from the group consisting of germanium and silicon, and having a predetermined polarity conductivity type, first and second input connections with said body for applying an alternating current through said body along an axis between two opposite ends of said body, a pair of electrodes connected to said body along another axis intermediate the ends of said body substantially orthogonal to said axis of said body, said electrodes having a polarity conductivity type opposite to the polarity conductivity type of said body, an output circuit comprising a first and second output terminal, said electrodes connected to said first output terminal, and a return current path connected between said second output terminal and said second input connection.

8. In a semiconductor apparatus, the combination comprising, a body of semiconductor material selected from a group comprising germanium and silicon, and having a predetermined polarity conductivity type, first and second input connections on said body for applying an alternating current through said body along an axis between two opposite ends of said body, a pair of electrodes connected through said body on opposite sides thereof along another axis substantially orthogonal to said axis intermediate the ends of said body, said electrodes having a polarity conductivity type opposite to the polarity conductivity type of said body, an output circuit comprising first and second output terminals, said electrodes connected to said first output terminal, a return current path comprising a voltage divider connected between said first input connection and said second input connection for dividing the return current to said input connections equally, and a return current path between said second output terminal and said voltage divider intermediate the ends thereof for dividing equally the current returning to said first and said second input connections.

9. In a semiconductor apparatus, the combination comprising, a germanium body member of predetermined polarity conductivity type, means for applying an alternating current through said body along an axis between two opposite ends of said body, a pair of electrodes connected to said body on opposite sides thereof and positioned along another axis substantially orthogonal to said axis intermediate the ends thereof, said electrodes having a polarity conductivity type opposite to the polarity conductivity type of said body, and an output circuit including a first and second output terminal, said electrodes being connected to said first output terminal forming a common path to an output load to vary the current therein as the sum of the current through said pair of electrodes.

10. In a semiconductor apparatus, the combination comprising, a body of germanium material of a predetermined polarity conductivity type, means including first and second input connections with said body for applying an alternating current through said body along an axis between two opposite ends of said body, a pair of electrodes connected to said body on opposite sides thereof along another axis substantially orthogonal to said axis, said electrodes having a polarity conductivity type opposite to the polarity conductivity type of said body, an output circuit including first and second output terminals, said electrodes connected to said first output terminal, a return current path including a voltage divider connected between said first and said second input connections, and a return current path between said second output terminal and said voltage divider for dividing equally the currents passing through said first and said second input connections.

11. In a semiconductor apparatus, the combination comprising, a silicon body of a predetermined polarity conductivity type, means for applying an alternating current through said body along an axis between two opposite ends of said body, a pair of electrodes connected to said body on opposite sides thereof along another axis substantially orthogonal to said axis, said electrodes having a polarity conductivity type opposite to the polarity conductivity type of said body and an output circuit including a first and second output terminal, said electrodes being connected to said first output terminal for applying currents from said electrodes to an output load connected across said first and second terminal which varies as the sum of the currents through said pair of electrodes.

12. In a semiconductor apparatus, the combination comprising, a body of semiconductor material having a first semiconductivity type, first and second input connections with said body for applying an alternating current through said body along an axis between two opposite ends of said body, a pair of electrodes of a second semiconductivity type connected to said body along another axis intermediate the ends of said body substantially orthogonal to said axis of said body, an output circuit comprising a first and second output terminal, said electrodes being directly connected to one another and thence to said first output terminal, and a return path connected between said second output terminal and said second input connection.

13. In a semiconductor apparatus, the combination comprising, a body of semiconductor material having a predetermined semiconductivity type, first and second input connections with said body for applying an alternating current through said body along an axis between two opposite ends of said body, a pair of electrodes of another semiconductivity type connected to said body along another axis intermediate the ends of said body substantially orthogonal to said axis of said body, said electrodes having interconnecting means, said interconnecting means providing a direct connection between said electrodes, an output circuit comprising a first and second output terminal, said electrodes directly connected to said first output terminal, and a return current path connected between said second output terminal and said second input connection.

References Cited in the file of this patent

UNITED STATES PATENTS

| | | |
|---|---|---|
| 2,790,037 | Shockley | Apr. 23, 1957 |
| 2,901,554 | Lesk | Aug. 25, 1959 |
| 2,927,221 | Armstrong | Mar. 1, 1960 |
| 2,933,619 | Heywang | Apr. 19, 1960 |